United States Patent
Miller et al.

(10) Patent No.: US 7,106,823 B2
(45) Date of Patent: Sep. 12, 2006

(54) SYSTEM AND METHOD FOR ACCELERATED CLOCK SYNCHRONIZATION OF REMOTELY DISTRIBUTED ELECTRONIC DEVICES

(75) Inventors: Kevin Miller, Lawrenceville, GA (US); Anders Hebsgaard, Lawrenceville, GA (US)

(73) Assignee: Broadcom Corporation, Irvine, CA (US)

( * ) Notice: Subject to any disclaimer, the term of this patent is extended or adjusted under 35 U.S.C. 154(b) by 756 days.

(21) Appl. No.: 10/294,661

(22) Filed: Nov. 15, 2002

(65) Prior Publication Data
US 2004/0109498 A1    Jun. 10, 2004

(51) Int. Cl.
*H03D 3/24* (2006.01)

(52) U.S. Cl. .................... 375/376; 375/375; 375/222

(58) Field of Classification Search ............ 375/376, 375/375, 373, 374, 222; 369/47.25
See application file for complete search history.

(56) References Cited

U.S. PATENT DOCUMENTS

| | | | | |
|---|---|---|---|---|
| 5,598,396 A | * | 1/1997 | Horibe et al. | 369/47.25 |
| 6,490,295 B1 | * | 12/2002 | Cooklev et al. | 370/465 |
| 6,563,897 B1 | * | 5/2003 | Kitta | 375/375 |

* cited by examiner

*Primary Examiner*—Phuong Phu
(74) *Attorney, Agent, or Firm*—Sterne, Kessler, Goldstein & Fox, P.L.L.C.

(57) ABSTRACT

A timing recovery system and method for accelerated clock synchronization of remotely distributed electronic devices is provided. The system includes a phase locked loop, a linear estimator and control logic. The method includes sampling a clock signal received from an electronic device, applying a linear estimation technique to estimate the frequency and phase of the received signal and providing those estimates to a phase locked loop to accelerate the phase locked loop acquisition rate and secure signal lock quickly.

9 Claims, 5 Drawing Sheets

SYSTEM AND METHOD FOR ACCELERATED CLOCK SYNCHRONIZATION OF REMOTELY DISTRIBUTED ELECTRONIC DEVICES

BACKGROUND OF THE INVENTION

1. Field of the Invention

The present invention relates to clock synchronization of remotely distributed electronic devices, and more particularly, to accelerating the acquisition rate of a phase locked loop used in a timing recovery system.

2. Background of the Invention

In the last several years distributed computing and communications systems that rely on or provide high speed data communications have become nearly ubiquitous. Such systems may include, but are not limited to, broadband communication systems using cable modems, satellite communication systems, fiber to the home (FTTH) communications networks, and board-to-board interconnections in a myriad of electronic devices.

In many of these systems, the clocks in remotely distributed devices must be synchronized for efficient operation. There are many reasons why remotely distributed devices may need to have their clocks synchronized. Two of the more common reasons relate to the efficient functioning of the devices. In particular, in a digital communication system the receiving device must be properly synched to a sending device to enable the efficient processing and interpretation of an incoming data stream. If the devices are not properly synchronized, the receiving device may not be able to properly interpret data being transmitted to it. Additionally, in a scenario where time division multiplexing is used to allocate bandwidth to many remotely distributed devices for signal transmission to a single master device, the remotely distributed devices often must be time synchronized. If the clocks of the remote devices are not synchronized with the clock of the master device, an undesirable situation may arise, such that, the remote devices transmit data at the same time or in the wrong time slots leading to confusion and loss of data at the master device.

Phase locked loop (PLL) systems are typically used to facilitate clock synchronization of remotely located devices. A PLL system is a feedback system in which the feedback signal is used to lock the output frequency and phase to the frequency and phase of an input signal. FIG. 1 illustrates the basic architecture of a PLL system. As depicted in FIG. 1 the basic components include phase detector 110, loop filter 120 and voltage controlled oscillator 130. Phase locked loops can be analog or digital with the majority being composed of both analog and digital components.

In the basic PLL system illustrated in FIG. 1, input signal V(t) 140 is applied to one input of phase detector 110 while the output signal X(t) 170 is applied to the other input of phase detector 110. The output of phase detector 110, E(t) 150, is a function of the phase difference between V(t) 140 and X(t) 170. Loop filter 120 filters out undesirable components from F(t) 150 and provides further control over the loop's frequency response. Thus, loop filter 120 produces an output signal, Y(t) 160, that is primarily a function of the phase difference between V(t) 140 and X(t) 170.

Voltage controlled oscillator 130 is an oscillator whose output frequency is a linear function of its input voltage over some range of input voltages. A positive voltage will cause the frequency of the output signal of voltage controlled oscillator 130 to be greater than its uncontrolled value, while a negative voltage will cause it to be less. When an input signal has a frequency and phase within a certain range, known as the capture range, the PLL system will go through a series of cycles in which the difference between V(t) 140 and X(t) 170 becomes smaller and smaller until the signals are substantially the same. The system is said to be "locked" when the frequency and the phase of V(t) 140 and X(t) 170 are substantially the same. If the input signal has a frequency and phase outside the capture range, the system will not achieve lock and V(t) 140 and X(t) 170 may diverge, instead of converging.

Acquisition rate is a key performance characteristic of a PLL system. Acquisition rate refers to the rate at which a PLL system achieves lock, that is, to generate an output signal, such as X(t) 170 that has the same phase and frequency as an input signal, such as V(t) 140. Acquisition rate is a function of a variety of factors. Among these factors are the quality of the circuit components, the range of the input signal frequency and phase, and the characteristics of the input signal (e.g., digital or analog, noise levels, etc.).

As communication speeds have increased, the need to accelerate acquisition rates has also increased. There are two basic situations when a PLL system needs to acquire lock to an input signal. These situations are upon system start-up and following the loss of lock during operation. When a PLL system is acquiring lock upon system start-up, the throughput degradation attributable to a slow acquisition rate may not be perceptible. However, when a system is operating and lock is lost, having a slow acquisition rate may significantly degrade performance. While start-up acquisition, by definition, only occurs once, re-acquisition during operation may occur many times. Because the re-acquisition occurs while data is likely being transmitted, data may be lost. The longer the re-acquisition, the more data is lost and the greater the time needed to recover the data. Thus, minimizing the acquisition time plays an important role in maximizing system throughput, particularly in environments where the signal or PLL lock may be lost frequently.

One type of communications system where the acquisition rate of clock signals is significant is a cable modem-based broadband communications system. Within a cable modem-based broadband communication system the two principle devices are cable modems and cable modem termination systems. In a broadband communications network that uses cable modems, typically many cable modems are connected to a single cable modem termination system. Cable modems are located at customer premises and typically connected to personal computers through an Ethernet connection. Cable modem termination systems are typically located within a service provider's network center, often known as a headend location. Cable modem termination systems exchange data with multiple cable modems at high speeds. Importantly, cable modem termination systems transmit clock signals to cable modems for synchronization that is critical to ensuring efficient operation and high throughput.

Cable modem networks transmit data at high speeds that require optimization of circuitry and procedures. In particular, in a typical cable modem network in the downstream direction (from the network to a user's computer) network speeds can reach 40 Mbps—an aggregate amount of bandwidth that is shared by multiple users. In some systems network speeds can reach speeds approaching 100 Mbs. Typically, the downstream speed per user is on the order of 1 to 3 Mbps. Thus, if acquisition of a clocking signal delays transmission of data by only a tenth of second, the cable modem termination system will be prevented from sending 4.0 Mb of data. Depending on how often clock synchronization is lost, this could result in a performance degradation of up to 10%. This is unlikely because clock synchronization is not typically lost once a second. Nonetheless, as service providers receive greater and greater pressure from consumers for higher speed transmission rates, it is critical for circuitry and procedures to be optimized.

Thus, when dealing with systems that are transmitting data at megabit speeds, such as current broadband cable modem communications systems, minimizing acquisition time is critical. While there currently are approaches to aid a PLL system to achieve lock and to reduce acquisition rates, these approaches are either relatively slow given current communication speeds or require complex circuitry.

SUMMARY OF THE INVENTION

The present invention is directed to a timing recovery system and accelerated clock recovery method for reducing the time that it takes for a remote electronic device to recover the clock signal being transmitted from another electronic device. The timing recovery system includes a phase locked loop, a linear estimator and control logic. The method includes sampling a signal received from an electronic device and applying a linear estimation technique to estimate the frequency and phase of the received signal. Then, these estimates are provided to an oscillator used within the phase locked loop to accelerate the acquisition rate and secure signal lock more quickly.

In one embodiment of the invention, the remote electronic device is a cable modem and the other electronic device is a cable modem termination system. In this embodiment, a cable modem termination system transmits a clock signal to a cable modem, pursuant to requirements in DOCSIS 2.0. DOCSIS 2.0 is an industry standard describing the protocols required for use between cable modems and cable modem termination systems. The cable modem must lock onto the clock signal and replicate it locally for efficient operation. The cable modem contains a timing recovery system, according to an embodiment of the invention. Upon receipt of the clock signal, the cable modem initiates an accelerated clock recovery method, according to an embodiment of the invention. The method includes sampling the input signal from the cable modem termination system, estimating future time stamp values and their frequency, and using those values to accelerate the acquisition rate of a phase locked loop contained within the timing recovery system. In the present invention, a 2-centroid linear estimation technique is adapted and used to estimate time stamp values and their frequency. Numerous methods exist for estimating the future time stamp values.

Use of the invention, provides a significant improvement in the time it takes for a remote electronic device to lock onto a clock signal from another electronic device. This improves the operational efficiency and enables data throughput rates to be higher than they would be without the use of the timing recovery system and accelerated clock recovery method, as disclosed herein.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Figure 2:
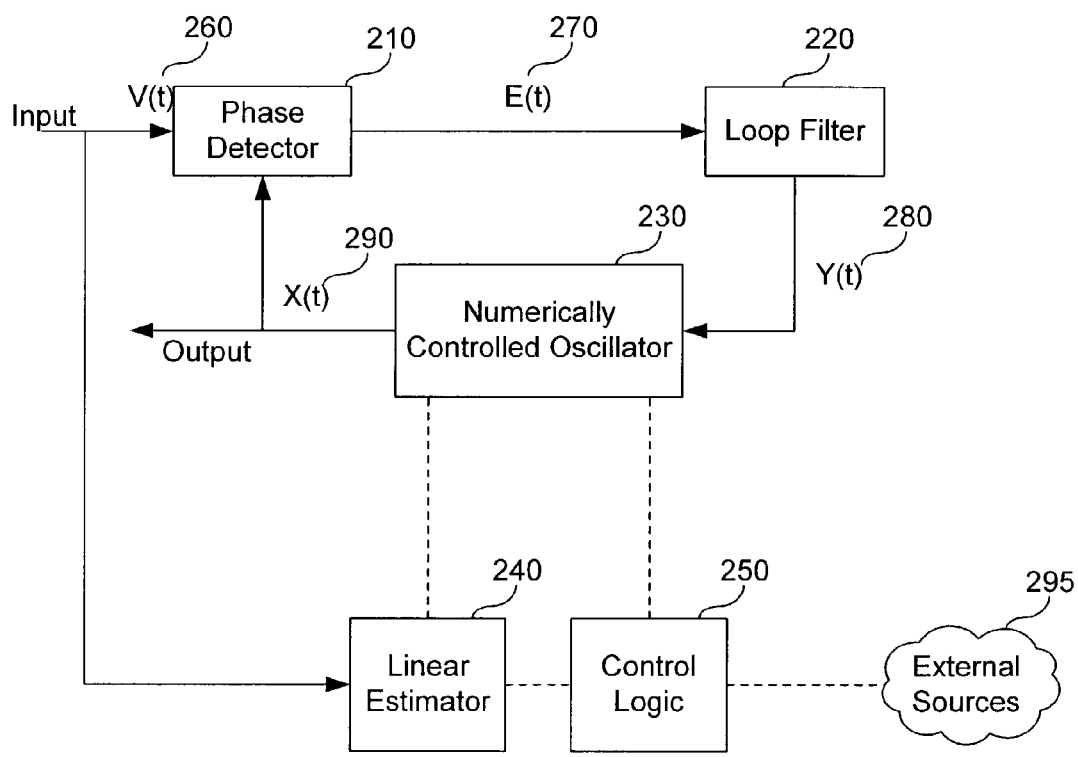
FIG. 2 is a diagram of a timing recovery system, according to an embodiment of the invention.

FIG. 2 illustrates timing recovery system 200, according to an embodiment of the invention. Timing recovery system 200 comprises phase detector 210, loop filter 220, numerically controlled oscillator 230, linear estimator 240 and control logic 250. The solid and dashed lines between these components represent electrical connections. Timing recovery system 200 may be used to quickly achieve clock synchronization between a first and second electronic device.

Control logic 250 and linear estimator 240 are electrically coupled to each other and to voltage controlled oscillator 230. Linear estimator 240 is also electrically coupled to input signal V(t) 260. Control logic 250 has electrical coupling to points external to timing recovery circuit 200 to enable it to receive information to determine what control action to take. Timing recovery system 200 may be implemented with integrated circuits and components that are readily known to individuals skilled in the relevant art(s).

Phase detector 210, loop filter 220 and numerically controlled oscillator 230 comprise a phase locked loop. Linear estimator 240 and control logic 250 enhance the operation of the phase locked loop by significantly accelerating the acquisition rate of the phase locked loop. Linear estimator 240 samples input signal, V(t) 260 and uses a linear estimation technique to estimate a starting frequency and phase for numerically controlled oscillator 230. Linear estimator 240 provides these estimates to numerically controlled oscillator 230 to greatly accelerate the acquisition rate of the phase locked loop circuit. Control logic 250 manages the operation of linear estimator 240 based on an internal clock and command instructions received from external sources 295. External sources 295 may be other systems or circuitry that are external to timing recovery system 200, such as an administrative module responsible for the overall operation of a device in which timing recovery system 200 is contained. In an alternative embodiment control logic 250 may be incorporated within linear estimator 240.

An exemplary embodiment of timing recovery system 200 has been presented. The invention is not limited to this example. This example is presented herein for purposes of illustration, and not limitation. Alternatives (including equivalents, extensions, variations, deviations, alternative approaches to combining functionality, etc., of those described herein) will be apparent to persons skilled in the relevant art(s) based on the teachings contained herein. Such alternatives fall within the scope and spirit of the invention.

Figure 1:
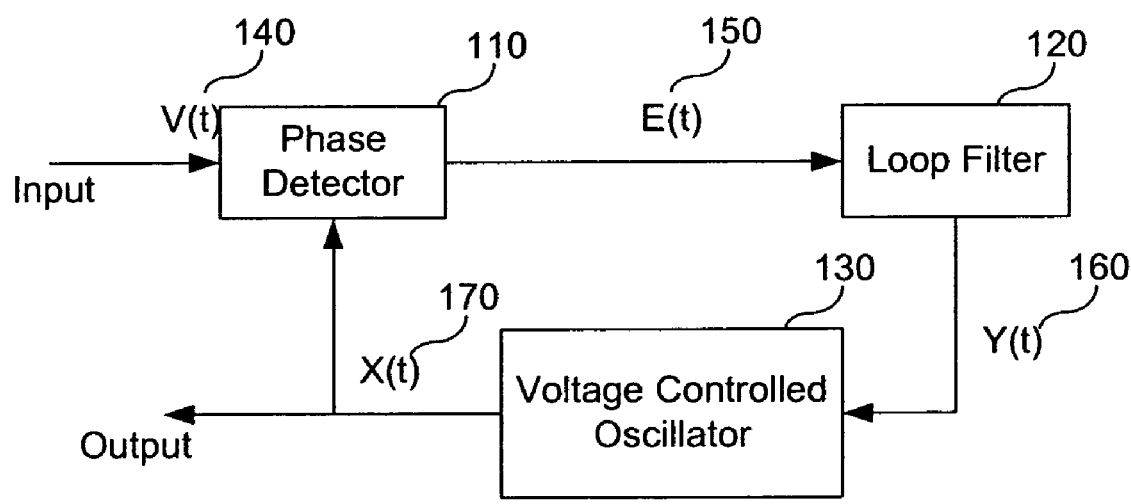
FIG. 1 is a diagram of a basic phase locked loop.

In one embodiment of the invention, timing recovery system 200 may be used to achieve clock synchronization between a cable modem and a cable modem termination system. In this embodiment, V(t) 260 represents an input signal containing a clock value sent by a cable modem termination system to a cable modem. As in the basic PLL system illustrated in FIG. 1, input signal V(t) 260 is applied to one input of phase detector 210 while the output signal X(t) 290 is applied to the other input of phase detector 210. The output of the phase detector, E(t) 270, is a function of the phase difference between V(t) 260 and X(t) 290. Loop filter 220 filters out undesirable components from E(t) 270 and provides further control over the loop's frequency response. Thus, loop filter 220 produces an output signal, Y(t) 280, that is primarily a function of the differences in phases between V(t) 260 and X(t) 290.

The input signal, V(t) 260 contains a timestamp value based on a clock located in the cable modem termination system. The cable modem seeks to lock onto this input signal, and replicate it locally through the use of timing recovery system 200. The clock signal contains a timestamp value, $T_{stamp}$ that is a linear function of the time that it is received.

Thus, the input signal value may be written as:

$$T_{stamp} = \alpha T_{received} + \beta$$

Where: $T_{stamp}$ equals the value of the clock signal timestamp, $T_{received}$ equals the time the clock signal is received by timing recovery system 200, and $\alpha$ and $\beta$ are functions of the frequency and phase of the clock signal.

Ideally, $\alpha$ and $\beta$ would be known a priori to timing recovery system 200. If this were the case, timing recovery system 200 could nearly instantaneously achieve lock with the incoming signal. Unfortunately, this is not the case. One reason why these parameters may not be known is because a cable modem may be connected to a number of cable modem termination systems (e.g., a cable modem termination system may be switched out for an upgrade or may simply fail), each with their own $\alpha$ and $\beta$. As stated previously, a cable modem will only be connected to a single cable modem termination system at any given time. However, for load sharing reasons or as a result of a cable modem termination system failure, a cable modem may be reconnected to a different cable modem termination system. Additionally, variable factors such as the temperature of the cable modem termination system may impact $\alpha$ and $\beta$ on a real time basis. While these variations may be small, to optimize performance the cable modem must be able to adapt to these changes.

Figure 3:
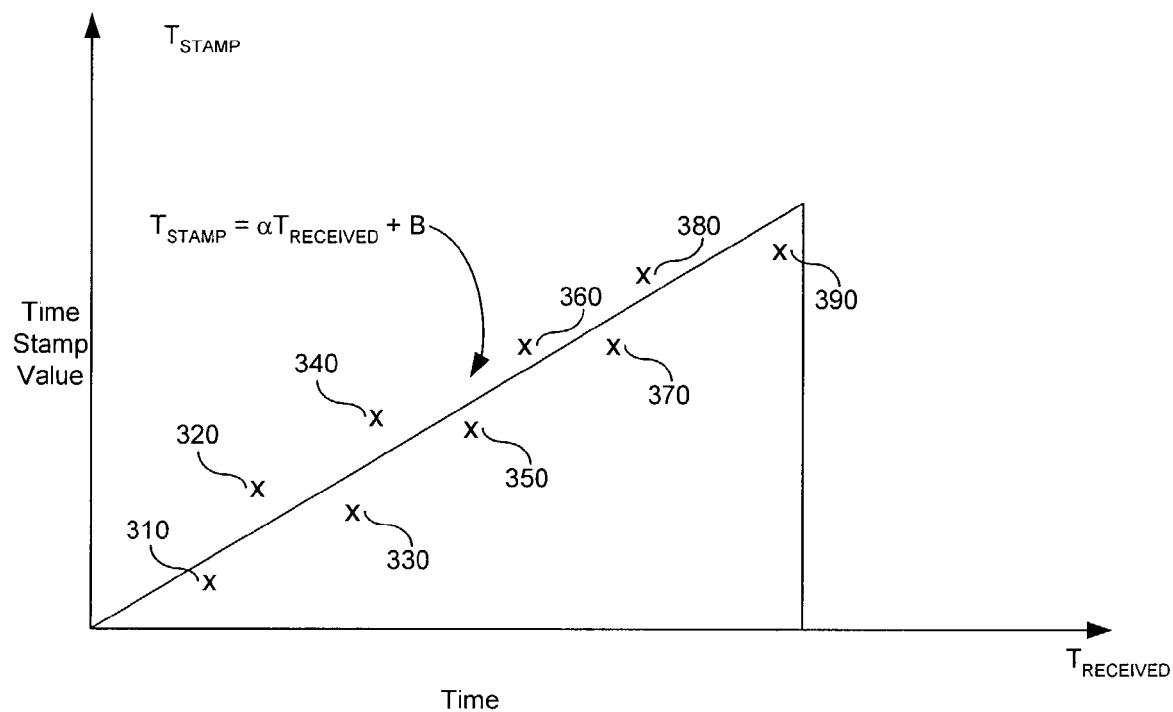
FIG. 3 is a plot showing timestamp values received by a cable modem from a cable modem termination system as a function of time.

FIG. 3 plots incoming $T_{stamp}$ values as a function of the time they are received. The incoming $T_{stamp}$ values are depicted by points 310 through 390. Ideally, each of these points would fall on the line specified by $T_{stamp} = \alpha T_{received} + \beta$. However, as shown in FIG. 3, because of real time changes in system temperature, impairments in the communications network or other real time factors, the data points do not fall exactly on the ideal line. This variation makes it difficult for timing recovery system 200 to acquire lock with the incoming timing signal and leads to acquisition times that may impair system performance.

Figure 4:
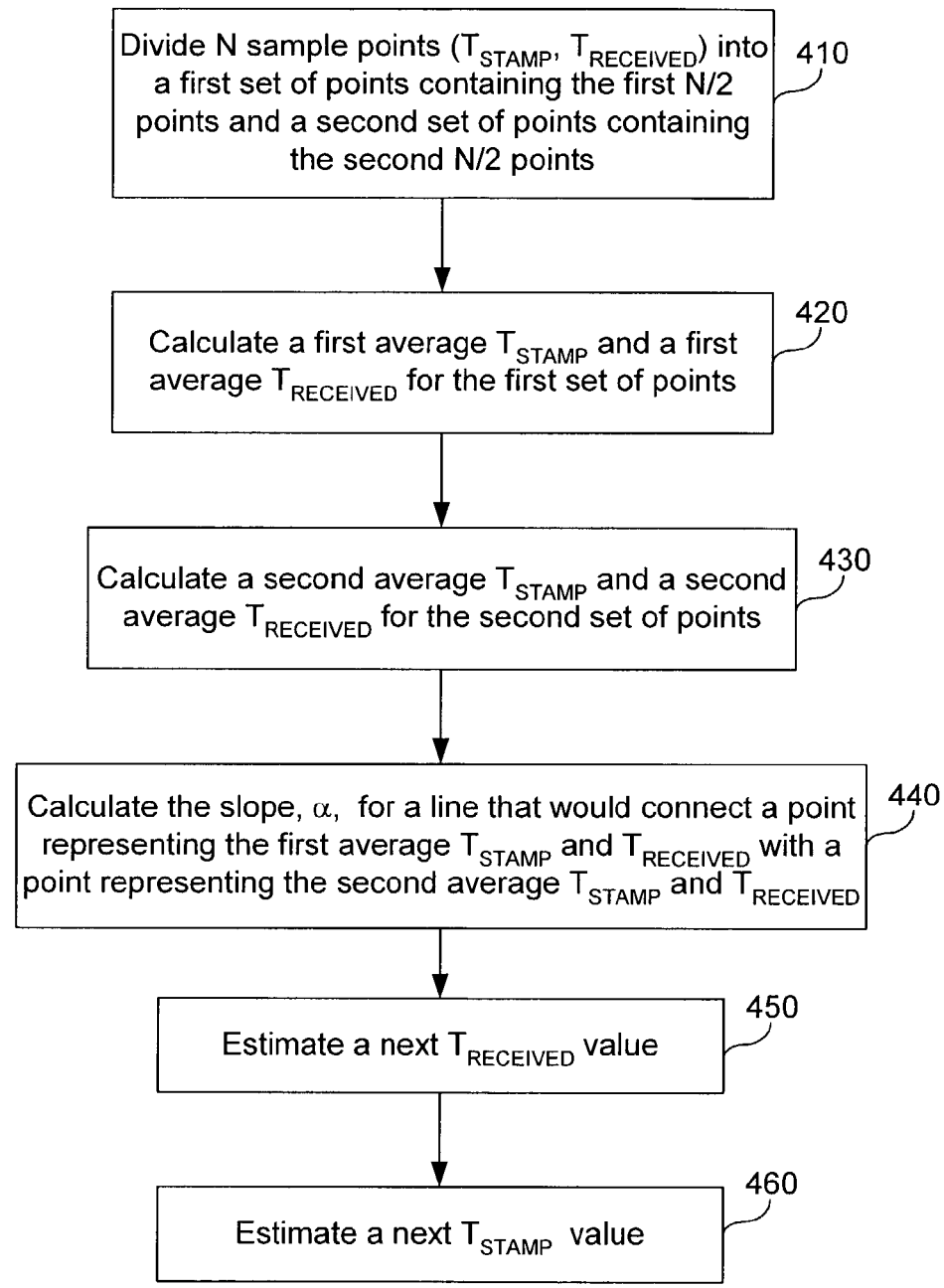
FIG. 4 is a method for estimating the frequency of timestamps, future time stamp values, and the time they will be received, according to an embodiment of the invention.

The process illustrated in FIG. 4 provides a method for estimating the frequency of timestamps and projecting future timestamp values, according to an embodiment of the invention. The method adapts a 2-centroid linear estimation technique to this application. The process begins in step 410. In step 410, N sample points [$T_{stamp}(n)$, $T_{received}(n)$], where n ranges from 1 to N, are divided into a first set of points consisting of N/2 sample points and into a second set of points consisting of N/2 sample points, where N may be any even integer.

In step 420, a first average $T_{stamp}$ and a first average $T_{received}$ is computed for the first set of N/2 sample points. Similarly, in step 430, a second average $T_{stamp}$ and a second average $T_{received}$ is computed for the second set of N/2 sample points.

In step 440, the slope of a line that would connect a point representing the first average $T_{stamp}$ value and the first average $T_{received}$ value to a point representing the second average $T_{stamp}$ value and the second average $T_{received}$ value is calculated. The slope of the line may be represented by $\alpha$.

In step 450, an estimate for a future $T_{received}$ value is made. The estimate is made by incrementing the last $T_{received}$ value that was sampled by a $\Delta t$, where $\Delta t$ is at least greater than the time to conduct the computations contained in step 410 through step 460.

In step 460, an estimate for the $T_{stamp}$ value corresponding to the future $T_{received}$ value estimated in step 450 is made. This estimate is made by incrementing $T_{stamp}(N)$ by the product of the slope calculated in step 440 and $\Delta t$. As discussed below, these estimates can then be provided to a numerically controlled oscillator, such as numerically controlled oscillator 230. The estimates may be provided by a linear estimator, such as linear estimator 240, to enable a timing recovery system (e.g., timing recovery system 200) to achieve signal acquisition more quickly than if the estimates were not provided. This process may then be used in the accelerated clock recovery method depicted in FIG. 5, and described below.

Figure 5:
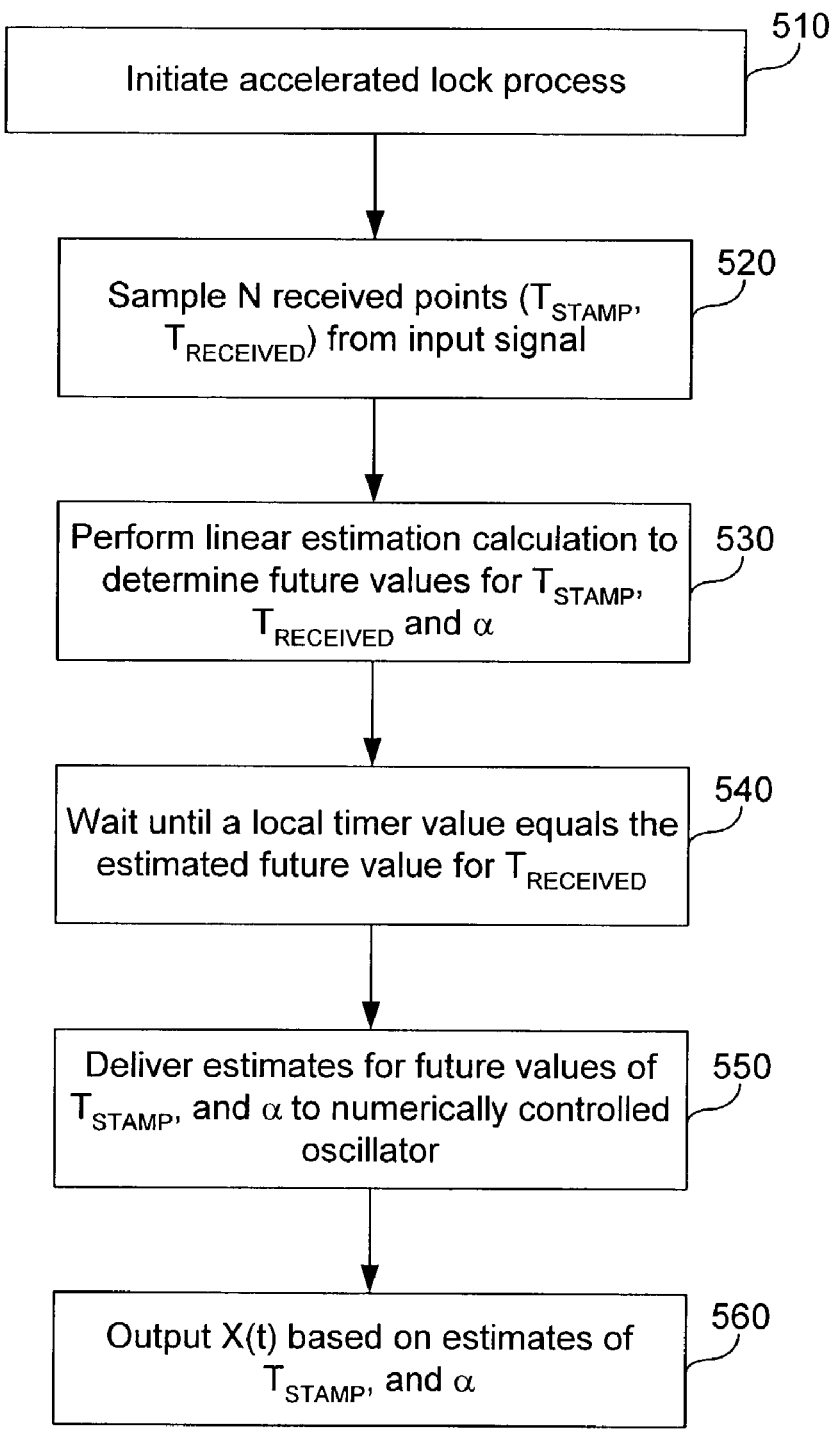
FIG. 5 is an accelerated clock recovery method for accelerating the acquisition rate of a phase locked loop contained in a timing recovery system, according to an embodiment of the invention.

The process illustrated in FIG. 5 provides an accelerated clock recovery method for accelerating the acquisition rate of a phase locked loop in a timing recovery system, according to an embodiment of the invention. The process begins in step 510. In step 510, control logic, such as control logic 250, initiates the process by instructing a linear estimator, such as linear estimator 240, to sample N timestamps from signal V(t) 260. Each sample point will consist of a $T_{stamp}$ value and a $T_{received}$ value. N may be any value of $2^n$ with n being an integer between 1 and 6. In some instances, n may be greater than 6. The choice of N will be a function of the precision desired given the characteristics of input signal V(t) 260, while considering that values of N that are not factors of $2^n$ or are larger than 256 will require more computation time and may also require more complex circuitry.

In step 520, linear estimator 240 samples N $T_{stamps}$ from signal V(t) 260. In step 530, linear estimator 240 performs a linear estimation calculation to estimate future values for $T_{stamp}$ and $T_{received}$, and to estimate $\alpha$. A wide range of linear estimation techniques may be used, such as, a least squares method, or the 2-Centroid based method described above and depicted in FIG. 4. Other linear estimation techniques will be apparent to persons skilled in the relevant art(s) and based on the teachings herein may be adapted for use with the invention. Such alternatives fall within the scope and spirit of the invention.

In step 540, linear estimator 240 waits until a local timer located in control logic 250 reaches a value equal to $T_{received}$.

When the local timer value equals $T_{received}$, then linear estimator 240 proceeds to step 550. In step 550, linear estimator 240 delivers the estimates of $T_{stamp}$ and α to numerically controlled oscillator 230. At this point, timing recovery system 200 declares that signal acquisition has been achieved, which allows an overall system to begin receiving and processing data. The phase lock loop continues to refine α according to normal operation. In step 550, numerically controlled oscillator 230 outputs X(t) 290 based on the inputs provided by linear estimator 240. The phase locked loop then proceeds to lock onto signal V(t) 260 according to the normal operation of a phase locked loop. The acquisition rate, however, will be significantly improved as a result of the estimates provided through the implementation of the method depicted in FIG. 5. The rate improves because the estimated values enable numerically controlled oscillator 230 to output a signal that is closer to V(t) more quickly than it would through normal operation.

For example, in the cable modem case, the DOCSIS 2.0 requirements specify that a cable modem termination system may transmit clock signals to cable modems at rates ranging from one clock signal every 1 to 200 milliseconds, depending on the purpose of the signal. Prior to implementation of the present invention, a typical cable modem needed approximately 400 clock signals to achieve phase lock, which took about 80 seconds, when the clock rate was 200 ms. Through implementation of the present invention, phase lock can be consistently achieved after the receipt of only 64 clock signals, taking only about 13 seconds, when the clock transmission rate is 200 ms. Comparison of the two approaches shows a substantial savings of approximately 67 seconds, or nearly an 84% improvement. Additionally, in some implementations fewer clock signals could be used depending on the known precision of the cable modem termination system clock and the level of precision needed at the cable modem. This would further reduce the acquisition times.

An exemplary embodiment of a timing recovery system and accelerated clock recovery method has been presented. The invention is not limited to this example. This example is presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

CONCLUSION

While various embodiments of the invention have been described above, it should be understood that they have been presented by way of example, and not limitation. It will be apparent to persons skilled in the relevant art that various changes in form and detail can be made therein without departing from the spirit and scope of the invention.

What is claimed is:

1. A timing recovery system of a first electronic device to synchronize the first electronic device with a second electronic device, comprising;
   a phase locked loop;
   a linear estimator that provides an estimated frequency and estimated phase to said phase locked loop, wherein said linear estimator samples received time stamp signals to estimate a rate of change of the sampled time stamps, wherein said linear estimator extrapolates said estimated frequency and said estimated phase based on the calculated rate of change; and
   control logic coupled to said linear estimator to manage said linear estimator.

2. The system of claim 1, wherein the first electronic device is a cable modem and the second electronic device is a cable modem termination system.

3. A timing recovery acceleration system of a first electronic device to accelerate an acquisition rate of a phase locked loop, comprising;
   a linear estimator that provides an estimated frequency and estimated phase to the phase locked loop, wherein said linear estimator samples received time stamp signals to estimate a rate of change of the sampled time stamps, wherein said linear estimator extrapolates said estimated frequency and said estimated phase based on the calculated rate of change; and
   control logic coupled to said linear estimator to manage said linear estimator.

4. The system of claim 3, wherein the first electronic device is a cable modem.

5. A method for estimating timestamp frequency and projected timestamp values sent by a first electronic device to a second electronic device, comprising;
   a. sampling N sample points from an input signal consisting of a timestamp value sent by the first electronic device to the second electronic device and a time when the timestamp was received, wherein N may be any multiple of $2^n$, wherein n may be any positive integer;
   b. dividing the N sample points into a first set of points consisting of the first N/2 sample points and a second set of points consisting of the second N/2 sample points;
   c. calculating a first average timestamp value and a first average time for the first set of points;
   d. calculating a second average timestamp value and a second average time for the second set of points;
   e. calculating a slope of a line that would connect a point representing the first average timestamp value and the first average time to a point representing the second average timestamp value and the second average time;
   f. estimating a next time value by incrementing the last time a sample point was received by a delta time value that is larger than the time to conduct steps (b) through (g); and
   g. estimating a next timestamp value by incrementing the last timestamp value that was sampled by the product of the slope and the delta time value.

6. The method of claim 5, wherein the first electronic device is a cable modem termination system and the second electronic device is a cable modem.

7. A method for accelerating an acquisition rate of a phase locked loop, comprising;
   a. sampling an input signal having timestamps to the phase locked loop;
   b. estimating a rate of change of timestamps within the input signal;
   c. adding the rate of change to a received timestamps to estimate a frequency and phase of said input signal using samples collected in step (a);
   d. providing the frequency and phase estimates determined in step (c) to the phase locked loop.

8. The method of claim 7, wherein step b comprises:
   i. sampling N sample points from an input signal consisting of a timestamp value sent by the first electronic device to the second electronic device and a time when the timestamp was received, wherein N may be any multiple of $2^n$, wherein n may be any positive integer;

ii. dividing the N sample points into a first set of points consisting of the first N/2 sample points and a second set of points consisting of the second N/2 sample points;

iii. calculating a first average timestamp value and a first average time for the first set of points;

iv. calculating a second average timestamp value and a second average time for the second set of points; and v. calculating a slope of a line that would connect a point representing the first average timestamp value and the first average time to a point representing the second average timestamp value and the second average time.

9. The method of claim 7, wherein step (c) comprises:

i. estimating a next time value by incrementing the last time a sample point was received by a delta time value that is larger than the time to conducts steps (b) and ii. estimating a next timestamp value by incrementing the last timestamp value that was sampled by the product of the slope and the delta time value.

* * * * *